(12) United States Patent
Chang

(10) Patent No.: US 7,283,369 B2
(45) Date of Patent: Oct. 16, 2007

(54) POWER SUPPLY WITH A SAFETY DEVICE

(75) Inventor: Hung-Jui Chang, Tamshui Chen (TW)

(73) Assignee: Acbel Polytechinc., Taipei Hsien (TW)

( * ) Notice: Subject to any disclaimer, the term of this patent is extended or adjusted under 35 U.S.C. 154(b) by 401 days.

(21) Appl. No.: 11/079,567

(22) Filed: Mar. 14, 2005

(65) Prior Publication Data
US 2006/0203432 A1 Sep. 14, 2006

(51) Int. Cl.
*G06F 1/16* (2006.01)
(52) U.S. Cl. .................... 361/726; 40/586; 312/223.1; 200/330
(58) Field of Classification Search .................. 40/586; 180/210; 320/112; 200/330; 312/223.1–223.6; 361/679–687, 724–727, 601; 174/72 A
See application file for complete search history.

(56) References Cited

U.S. PATENT DOCUMENTS 6,469,900 B2 * 10/2002 Cheng ........................ 361/726

| 2006/0203432 A1 * | 9/2006 | Chang | 361/601 |
| 2007/0084619 A1 * | 4/2007 | Kisu et al. | 174/72 A |
| 2007/0119080 A1 * | 5/2007 | Spencer | 40/586 |

\* cited by examiner

*Primary Examiner*—Hung Van Duong
(74) *Attorney, Agent, or Firm*—Alan Kamrath; Kamrath & Associates P.A

(57) ABSTRACT

A power supply has a chassis and a safety device. The chassis has a top, a bottom, a rear, a power switch, a mounting slot and an outlet. The outlet is mounted on the rear between the power switch and the mounting slot. The safety device is mounted on the chassis and has a plug bracket and a supply handle. The plug bracket is mounted slidably around the outlet on the rear of the chassis and has two locks. The supply handle is mounted pivotally through the mounting slot in the chassis. The plug bracket slides to an installation position to keep the power switch from turning on and allow a plug to attach to the outlet. Alternatively, the supply handle pivots to a safe position, and the plug bracket slides to a safe position to hold the supply handle and allow the power switch to turn on.

8 Claims, 11 Drawing Sheets

POWER SUPPLY WITH A SAFETY DEVICE

BACKGROUND OF THE INVENTION

1. Field of the Invention

The present invention relates to a power supply, and more particularly to a power supply with a safety device that prevents the power supply from being disconnected and prevents an electric plug in the power supply from being disconnected while the power supply operates.

2. Description of Related Art

A conventional power supply has a chassis and a plug bracket movably mounted on the chassis. When a plug is plugged into the chassis to supply power, the plug bracket is moved to a position to tightly hold the plug and prevent the plug from accidentally disconnecting.

Another conventional power supply has a chassis and a supply handle pivotally mounted on the chassis. When the power supply is mounted in an equipment casing to supply power, the supply handle pivots to a position to lock the power supply in the equipment and prevent the power supply from being accidentally disconnecting.

However, the power supply with the plug bracket or the supply handle still has poor safety.

To overcome the shortcomings, the present invention provides a power supply with a safety device to mitigate or obviate the aforementioned problems.

SUMMARY OF THE INVENTION

The main objective of the invention is to provide a power supply with a safety device that prevents the power supply from accidentally detaching from a piece of equipment and prevents an electric plug connected to the power supply from accidentally disconnecting while the power supply operates.

A power supply in accordance with the present invention comprises a chassis and a safety device.

The chassis has a top, a bottom, a rear, a power switch, a mounting slot and an outlet. The outlet is mounted on the rear between the power switch and the mounting slot.

The safety device is mounted on the chassis and has a plug bracket and a supply handle. The plug bracket is mounted slidably around the outlet on the rear of the chassis and has two locks. The supply handle is mounted pivotally through the mounting slot in the chassis.

The plug bracket slides to an installation position to keep the power switch from turning on and allow a plug to be plugged into the outlet. Alternatively, the supply handle pivots to a safe position, and the plug bracket slides to a safe position to hold the supply handle and allow the power switch to turn on.

Other objectives, advantages and novel features of the invention will become more apparent from the following detailed description when taken in conjunction with the accompanying drawings.

DETAILED DESCRIPTION OF PREFERRED EMBODIMENT

Figure 1:
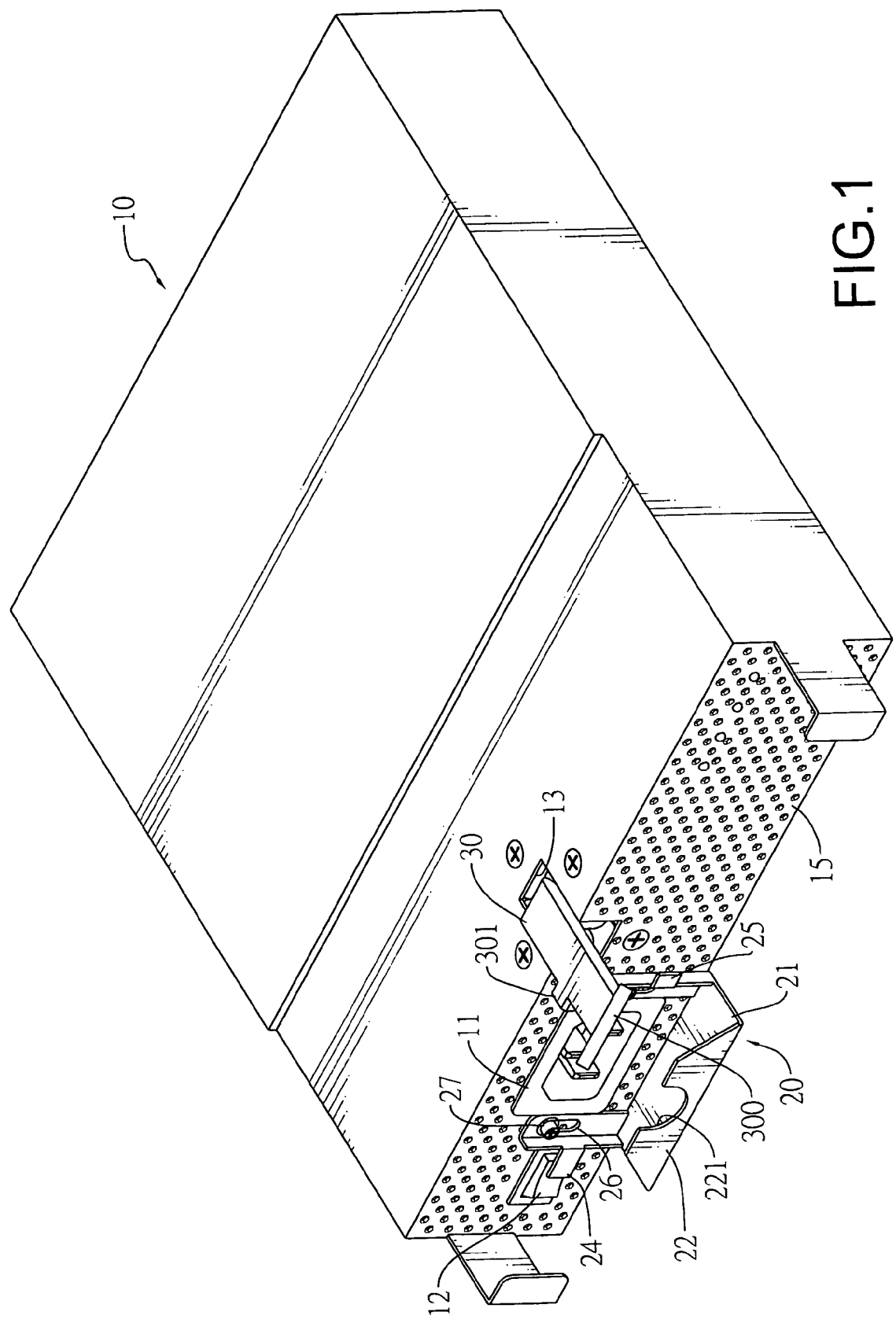
FIG. 1 is a perspective view of a power supply with a safety device in accordance with the present invention.

With reference to FIG. 1, a power supply in accordance with the present invention comprises a chassis 10 and a safety device.

Figure 2:
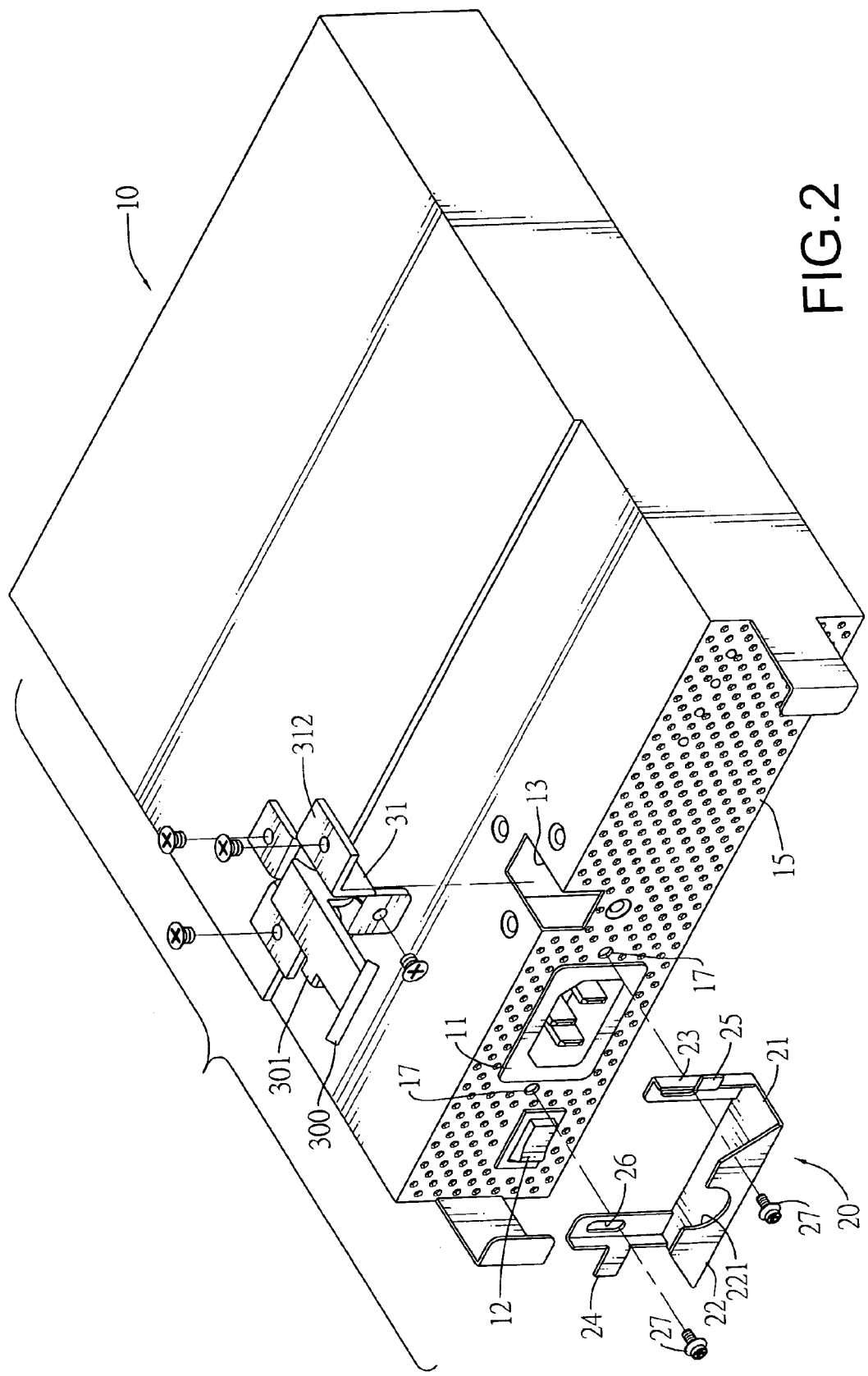
FIG. 2 is an exploded perspective view of the power supply in FIG. 1.

With reference to FIG. 2, the chassis has an inner surface, a top, a rear 15, a power switch 12, a mounting slot 13, an outlet 11 and two threaded holes 17. The power switch 12 is mounted pivotally on the rear 15. The mounting slot 13 is defined through the chassis 10 between the top and the rear 15. The outlet 11 is mounted on the rear 15 between the power switch 12 and the mounting slot 13 and has two opposite sides. The threaded holes 17 are defined through the rear 15 respectively adjacent to the opposite sides of the outlet 11.

The safety device is mounted on the chassis 10 and has a handle assembly and a bracket assembly.

Figure 3:
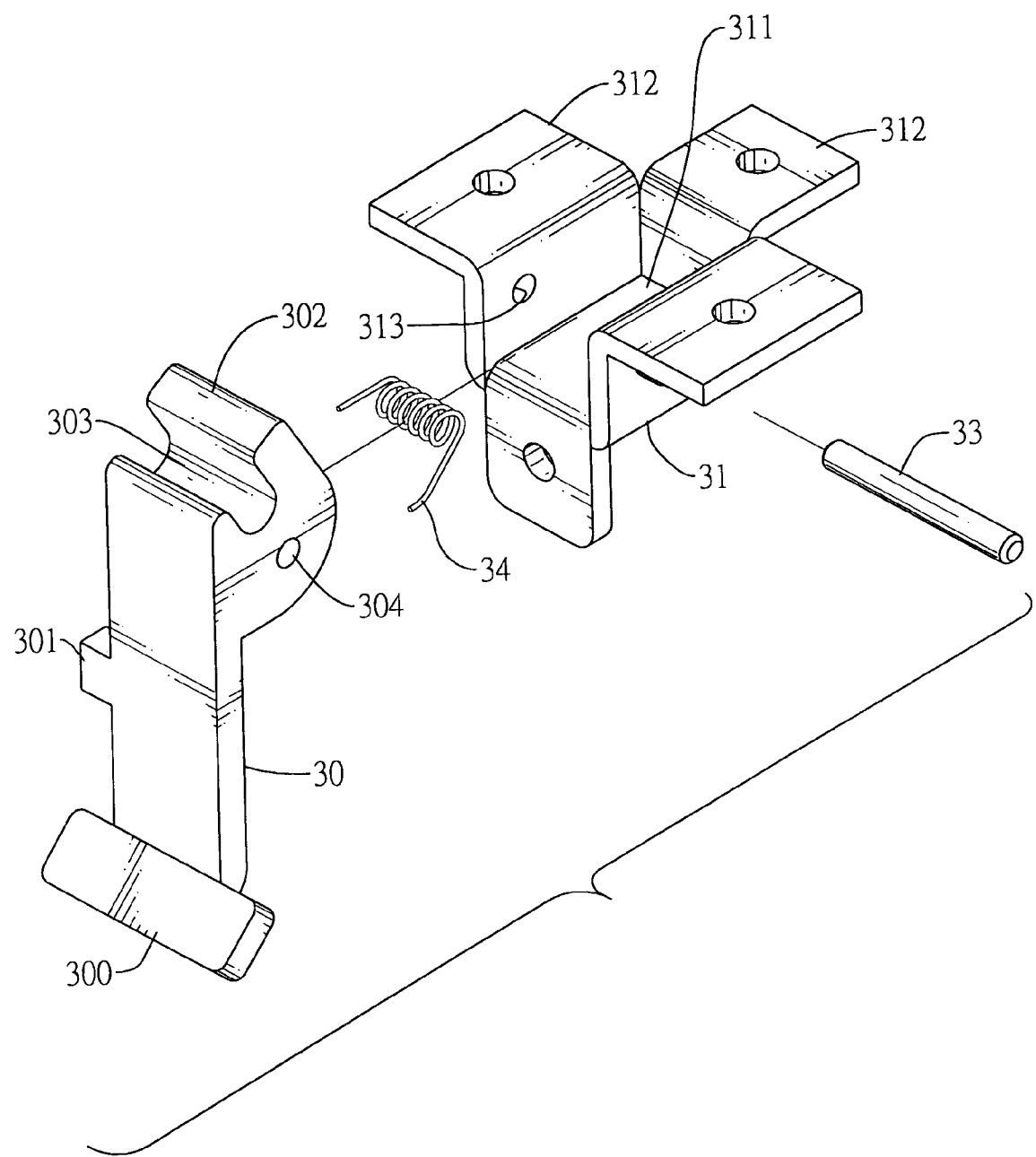
FIG. 3 is an exploded perspective view of the handle assembly on the power supply in FIG. 1.

With reference to FIGS. 2 and 3, the handle assembly is mounted through the mounting slot 13 in the chassis 10 and has a handle bracket 31, a supply handle 30, a pin 33 and a spring 34. The supply handle 30 has a proximal end being a hooking end, a distal end being a handling end opposite to the hooking end and a handle tab unit being a side tab 301 formed on one of two opposite sides of the handle 30.

With reference to FIG. 2, the bracket assembly is mounted slidably on the rear 15 of the chassis 10 and has a plug bracket 20 and two bolts 27. The plug bracket 20 has two opposites, a first lock unit corresponding to the power switch 12, and a second lock unit corresponding to the handle tab unit of the supply handle 30. The first lock unit is a switch tab 24 formed on one of the opposite sides of the plug bracket 20. The second lock unit is a handle tab 25 formed on the other of the sides of the plug bracket 20.

Figure 8:
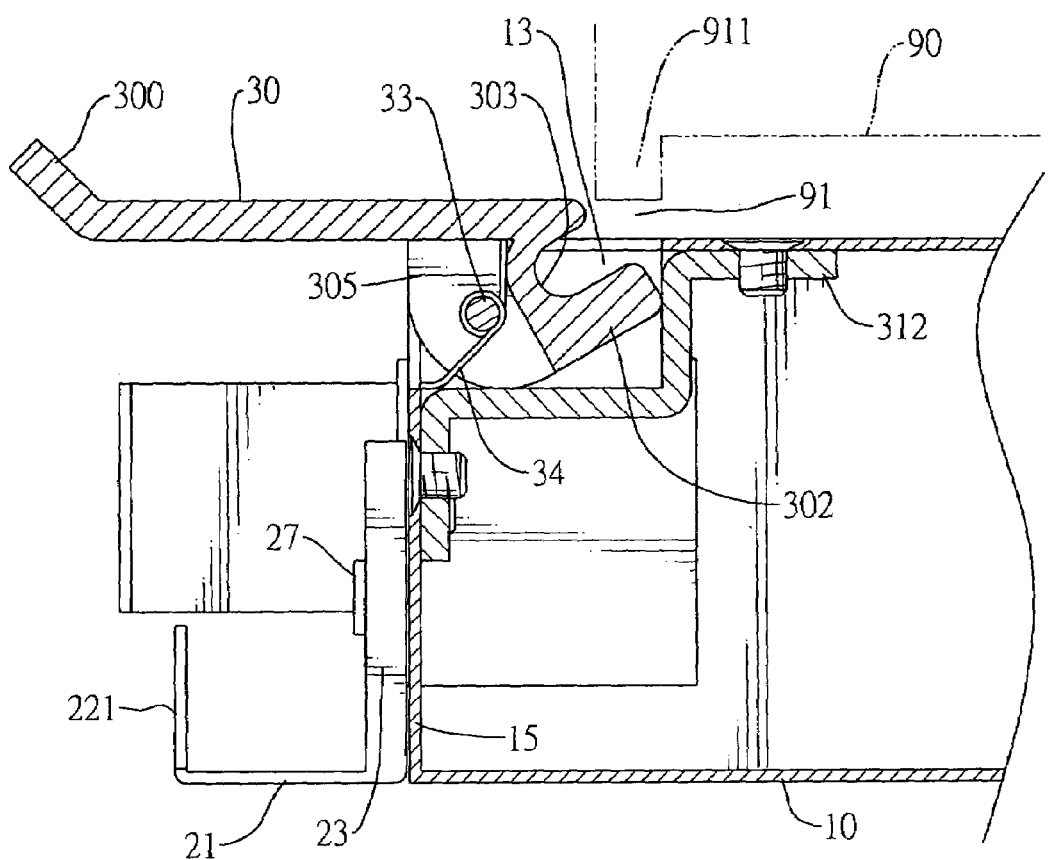
FIG. 8 is an operational side view in partial section of the power supply in FIG. 6A with the supply handle in an installation position.

With reference to FIGS. 3 and 8, the structure of the handle assembly will described in detail. The handle bracket 31 is mounted on the inner surface of the chassis 10, corresponds to the mounting slot 13 and has two opposite sides, an open top, an open front, a recess 311, multiple mounting tabs 312 and two pin holes 313. The open top has a top edge. The recess 311 is defined in the handle bracket 31 and communicates with the open top and the open front. The mounting tabs 312 extend perpendicularly from the top edge of the handle bracket 31 and are mounted on the inner surface of the chassis 10. The pin holes 313 are defined respectively through the sides of the handle bracket 31.

With reference to FIGS. 3 and 8, the supply handle 30 is mounted pivotally in the handle bracket 31 through the mounting slot 13 in the chassis 10 and pivots between an installation position and a safe position. The supply handle 30 has the proximal end, the distal end, the two opposite sides, the side tab 301, a hook 302, a positioning recess 303, a pin hole 304, a cavity 305 and a tail fin 300. The side tab 301 is formed on the side between the proximal and distal ends close to the outlet 11. The hook 302 is formed on the proximal end and is mounted pivotally in the recess 311 in the handle bracket 31. The positioning recess 303 is defined in the hook 302. The pin hole 304 is defined through the proximal end and is aligned with the pin holes 313 in the handle bracket 31. The cavity 305 is defined in the hook 302 opposite to the positioning recess 303. The tail fin 300 is formed on the distal end of the supply handle 30.

The pin 33 extends through the pin holes 313 in the handle bracket 31 and the pin hole 304 in the supply handle 30.

The spring 34 is mounted in the cavity 305 in the supply handle 30 adjacent to the handle bracket 31 around the pin 33 and biases the supply handle 30 to be parallel to the top of the chassis 10 in the installation position.

With reference to FIG. 2, the structure of the bracket assembly will be described in detail. The plug bracket 20 is mounted slidably on the rear 15 of the chassis 10 around the outlet 11 between the power switch 12 and the supply handle 30 and slides between an installation position and a safe position. The plug bracket 20 has the two opposite sides, a base 21, a positioning tab 22, two slides 23, the switch tab 24, the handle tab 25 and two rail slots 26. The base 21 has a front edge, a rear edge and two opposite sides. The positioning tab 22 extends perpendicularly from the rear edge of the base 21 and has a top edge and a notch 221 defined in the top edge. The slides 23 respectively extend perpendicularly from the sides adjacent to the front edge of the base 21 and correspond respectively to the threaded holes 17 between the power switch 12 and the mounting slot 13. The switch tab 24 is formed on the slide 23 close to the power switch 12 and aligns with the power switch 12. The handle tab 25 is formed on the slide 23 close to the supply handle 30 and aligns with the side tab 301 on the supply handle 30. The rail slots 26 are longitudinally defined respectively through the slides 23 and are aligned respectively with the threaded holes 17 in the chassis 10.

The bolts 27 are mounted respectively through the rail slots 26 and screw respectively into the threaded holes 17 in the chassis 10.

The power supply is switched between an installation mode and a safe mode by adjusting the safety device manually.

With reference to FIG. 1, the power supply is placed in the installation mode by sliding the plug bracket 20 down relative to the rear 15 of the chassis 10 to the installation position. The supply handle 30 pivots freely.

Figure 4:
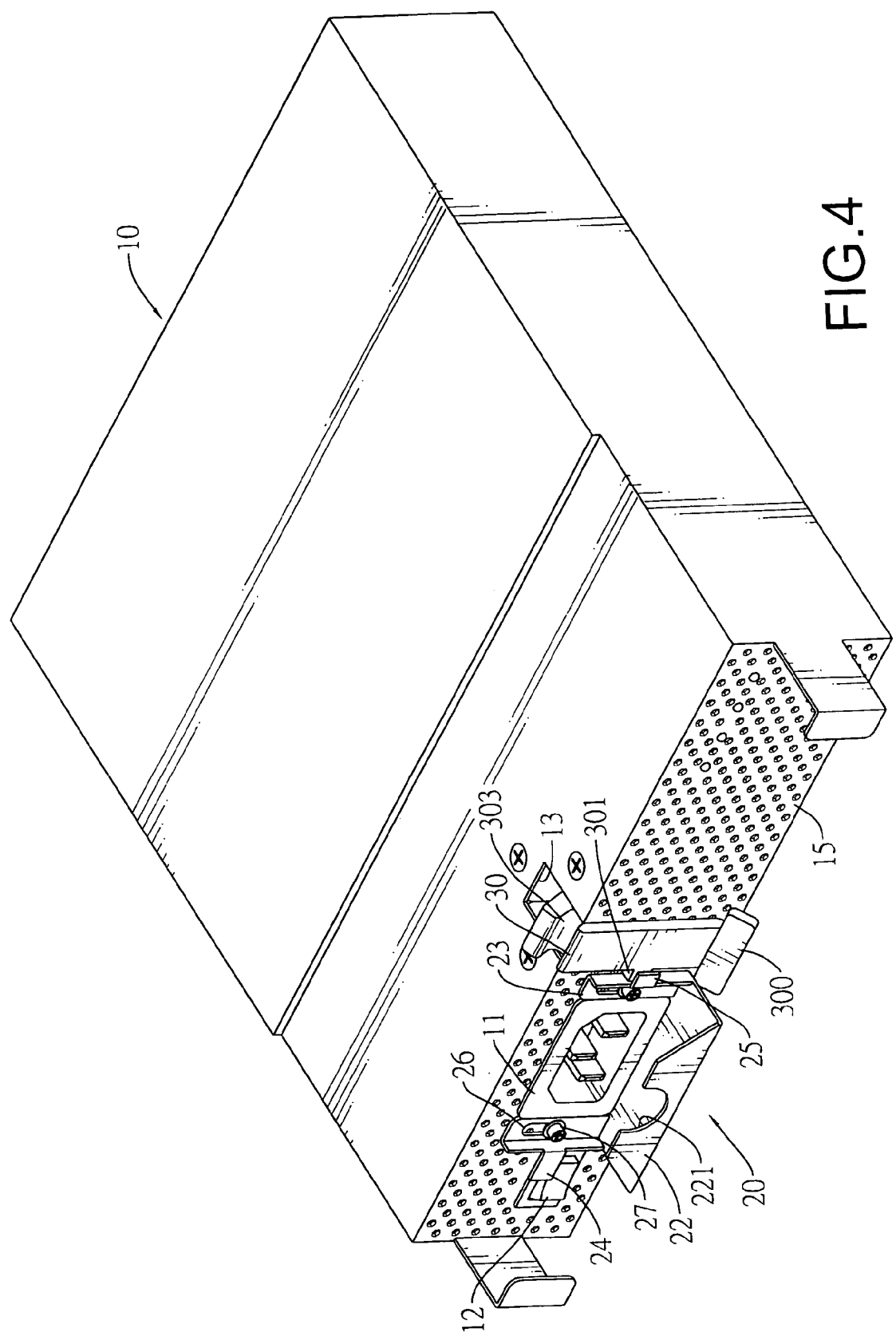
FIG. 4 is an operational perspective view of the power supply in FIG. 1.

With reference to FIG. 4, the power supply is placed in the safe mode by pivoting the supply handle 30 to the safe position parallel to the rear 15 of the chassis 10. The plug bracket 20 slides up relative to the rear 15 of the chassis 10 to the last and reaches the safe position and secures the supply handle 30.

Figure 5:
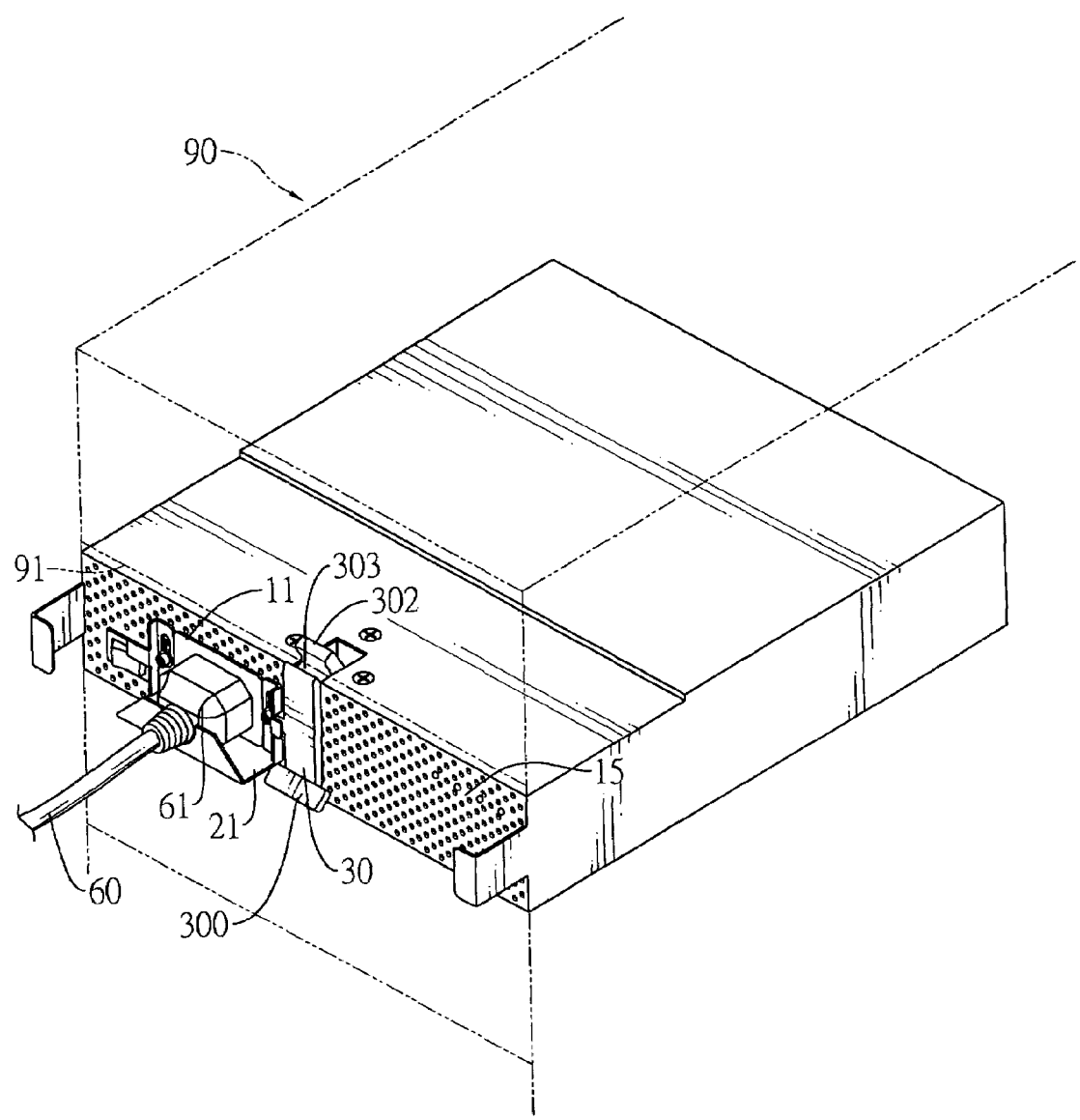
FIG. 5 is a perspective view of an equipment casing with the power supply in FIG. 1.

With reference to FIGS. 5 and 8, the power supply used with a power cord 60 is mounted in an equipment casing 90. The power cord 60 has a proximal end and a plug 61. The equipment casing 90 has a power supply slot 91. The power supply slot 91 has a top edge and a longitudinal protrusion 911 extending from the top edge of the power supply slot 91.

Figure 6:
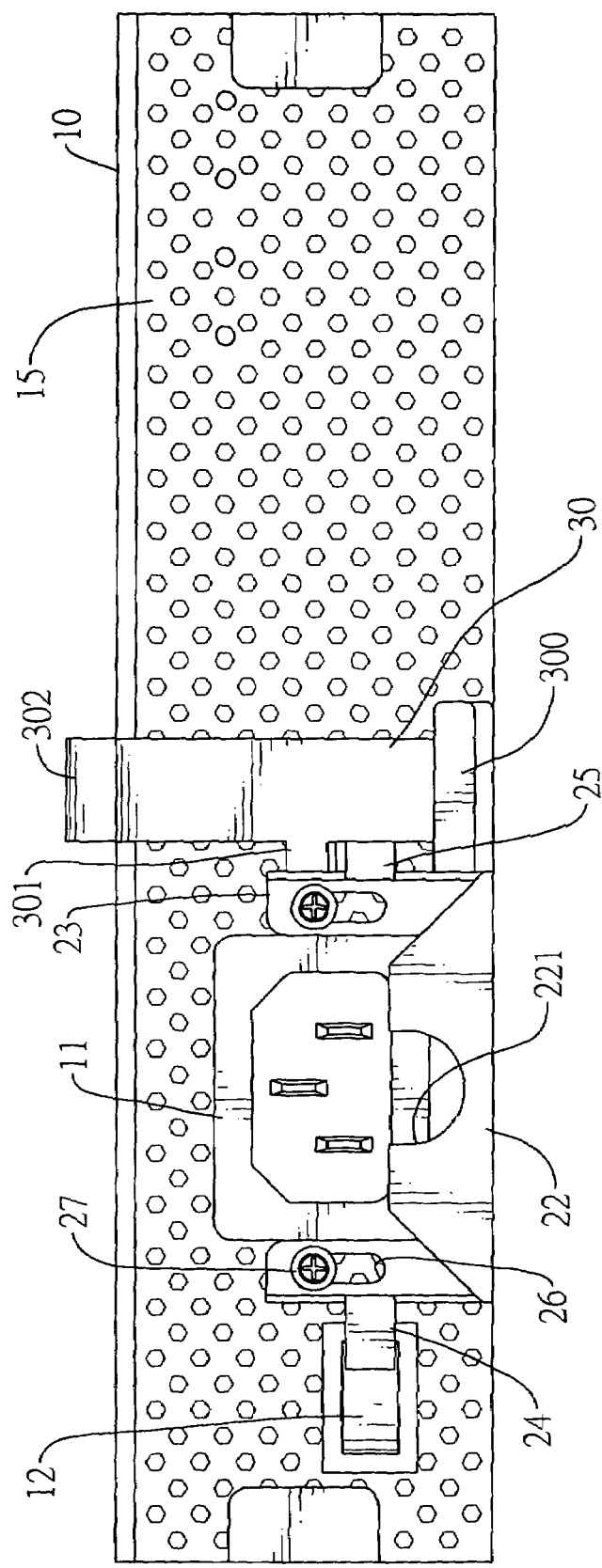
FIG. 6 is an operational rear view of the power supply in FIG. 5 with the plug bracket in an installation position.
Figure 6A:
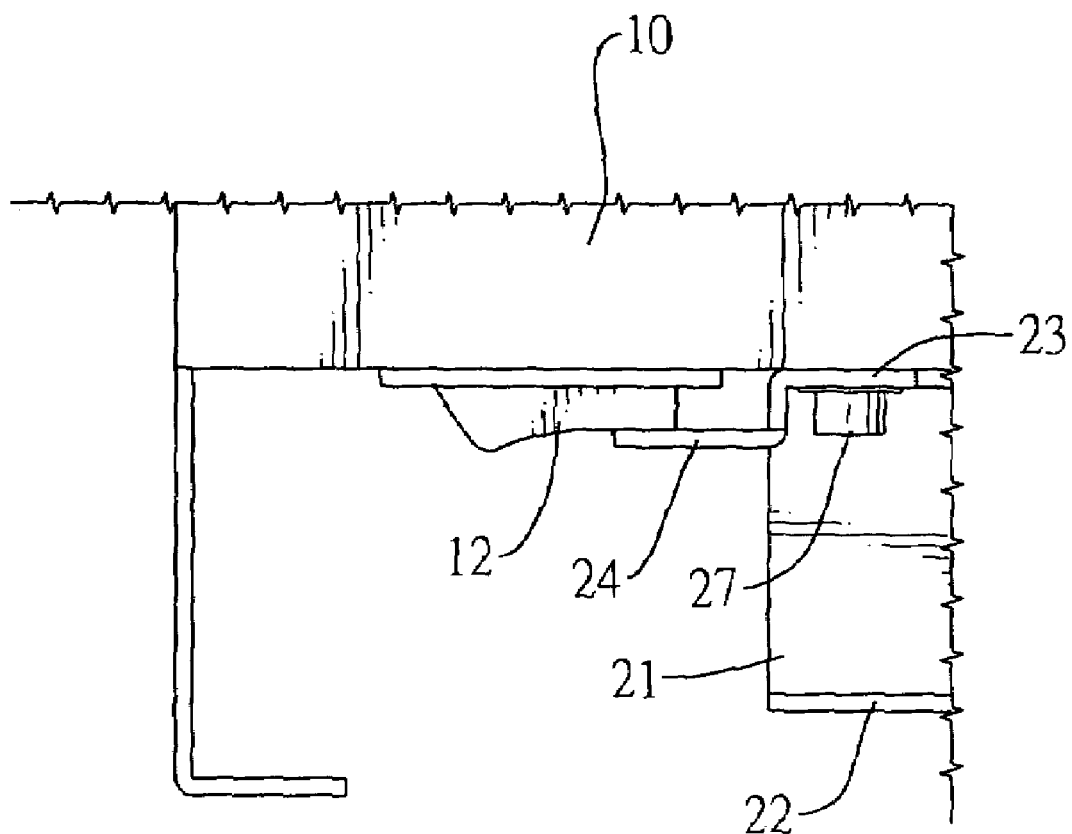
FIG. 6A is an operational top view of the power supply in FIG. 6.

With reference to FIGS. 6 and 6A (FIG. 6A is an enlarged operational top view of the power switch 12 and the chassis 10 of power supply the in FIG. 6), the power supply must be in the installation mode before the plug 61 is attached to the power supply and the power supply is installed in supply slot 91 of the equipment casing 90 as shown in FIG. 5. In the installation mode, the power switch 12 is turned off and the plug bracket 20 slides down relative to the rear 15 to the end and reaches the installation position. The switch tab 24 on the plug bracket 20 aligns with and covers the power switch 12 to keep the power switch 12 from turning on. The handle tab 25 misaligns with the side tab 301 on the supply handle 30 so that the supply handle 30 pivots freely.

Figure 7:
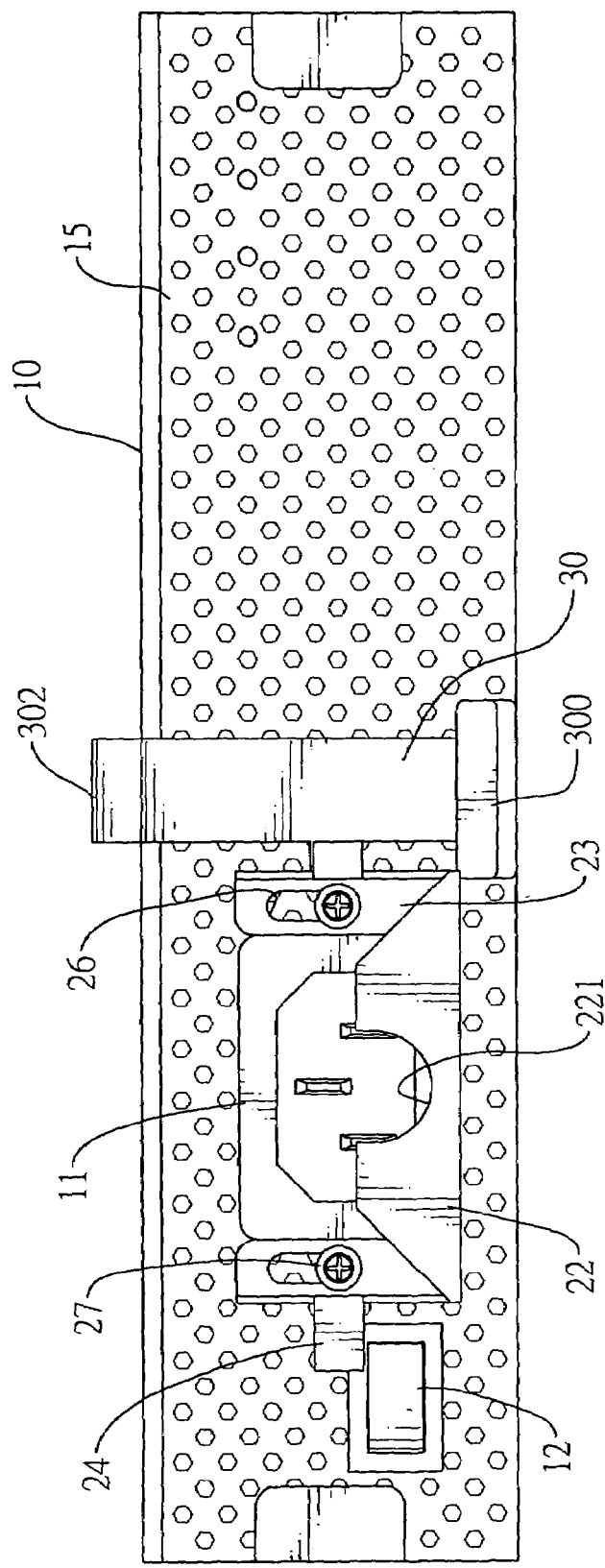
FIG. 7 is an operational front view of the power supply in FIG. 5 with the plug bracket in a safe position.
Figure 7A:
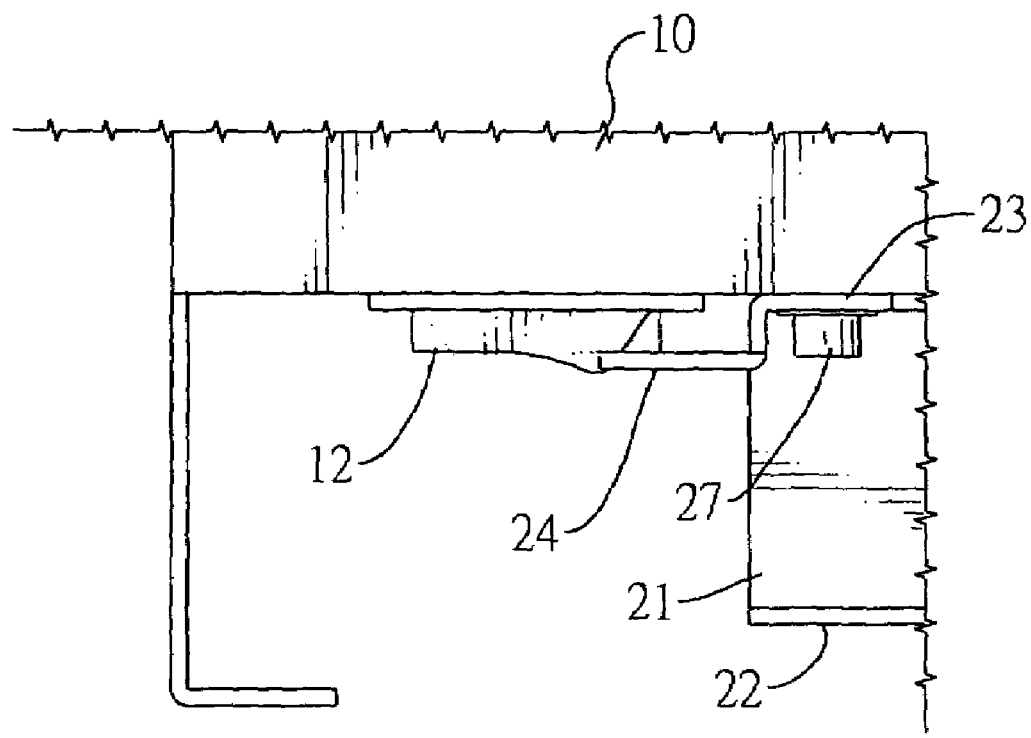
FIG. 7A is an operational top view of the power supply in FIG. 7.

With reference to FIGS. 7 and 7A (FIG. 7A is an enlarged operational top view of the power switch 12 and the chassis 10 of power supply the in FIG. 7), the power supply is placed in the safe mode after the plug 61 is attached to the power supply and the power supply is installed in the supply slot 91 in the equipment casing 90 as shown in FIG. 5. In the safe mode, the supply handle 30 is pivoted to the safe position. Sliding the plug bracket 20 up to the safe position securely holds the plug 61 in the notch 221 in the positioning tab 22, releases the power switch 12 from the switch tab 24 on the plug bracket 20 and aligns the handle tab 25 on the plug bracket 20 with the side tab 301 on the supply handle 30. Therefore, the supply handle 30 and the plug 61 are unmovable. When the power supply operates in the equipment casing 90 with the power switch 12 turning on, the switch tab 24 is blocked by the power switch 12 and is unable to move down. Therefore, the plug bracket 20 is unmovable unless the power switch 12 turns off.

Figure 9:
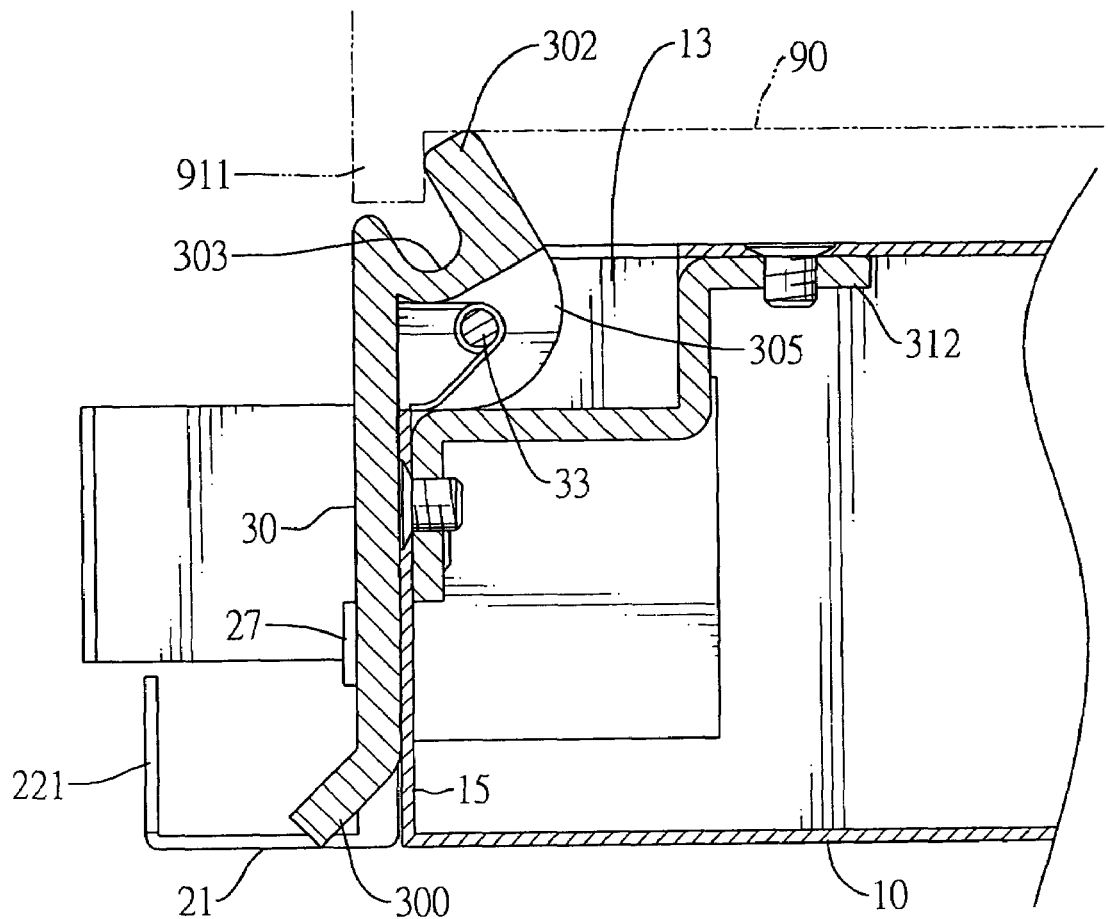
FIG. 9 is an operational side view in partial section of the power supply in FIG. 8 with the supply handle in a safe position.

With reference to FIGS. 8 and 9, to insert the plug 61 into the outlet 11, the power switch 12 is in the installation mode. The supply handle 30 is pivoted to the installation position and is parallel to the top of the chassis 10. The positioning recess 303 in the supply handle 30 is aligned with the longitudinal protrusion 911 in the equipment casing 90. Next, the power supply is inserted supply slot 91 in the equipment casing 90. The supply handle 30 is pivoted to the safe position and is parallel to the rear 15 of the chassis 10. The hook 302 engages the longitudinal protrusion 911 on the equipment casing 90 and a reacting force from the longitudinal protrusion 99 pushes the power supply further into the supply slot 91 to completely engage the equipment casing 90. Then, the plug bracket 20 is slid up to the safe position to securely lock the plug 61 and the power supply.

The power supply with the safety device can be switched the safe mode to prevent the power supply from accidentally detaching from the equipment to which power is being supplied and prevent the plug on the power supply from accidentally disconnecting while the power supply is operating. Therefore, the safety of the power supply is improved substantially.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A power supply comprising:
   a chassis having an inner surface, a top, a rear, a power switch mounted pivotally on the rear, an outlet mounted on the rear; and
   a safety device mounted on the chassis and having
      a handle assembly mounted on the chassis and having
         a supply handle mounted pivotally on the chassis, pivoting between an installation position and a safe position and having a proximal end being a hooking end, a distal end being a handling end opposite to the hooking end, two opposite sides and a handle tab unit formed on the supply handle; and a bracket assembly mounted on the rear of the chassis and having
- a plug bracket mounted slidably on the rear of the chassis around the outlet between the power switch and the supply handle, sliding between an installation position and a safe position and having a first lock unit formed on the plug bracket and corresponding to the power switch, and a second lock unit formed on the plug bracket and corresponding to the handle tab unit of the supply handle;

wherein:

the first lock unit on the plug bracket is aligned with and covers the power switch to keep the power switch from turning on when the plug bracket slides to the installation position; and the second lock unit on the plug bracket is aligned with and covers the handle tab unit on the supply handle to prevent the supply handle from pivoting when the supply handle pivots to the safe position and the plug bracket slides to the safe position.

2. The power supply as claimed in claim 1, wherein:
the chassis further has two threaded holes defined through the rear adjacent to the opposite sides of the outlet;
the plug bracket further has
- a base having a front edge, a rear edge and two opposite sides;
- a positioning tab extending perpendicularly from the rear edge of the base and having a top edge and a notch defined in the top edge;
- two slides respectively extending perpendicularly from the sides adjacent to the front edge of the base and corresponding respectively to the threaded holes between the power switch and the mounting slot;
- two rail slots longitudinally defined respectively through the slides and aligned respectively with the threaded holes in the chassis; and
the bracket assembly further has two bolts mounted respectively through the rail slots and screw respectively into the threaded holes in the chassis.

3. The power supply as claimed in claim 2, wherein:
the handle tab unit is a side tab formed on the side of the supply handle between the proximal and distal ends close to the outlet;
the first lock unit is a switch tab formed on the slide close to the power switch and aligning with the power switch; and
the second lock unit is a handle tab formed on the slide close to the supply handle and aligning with the side tab on the supply handle.

4. The power supply as claimed in claim 3, wherein:
the plug bracket slides down relative to the rear of the chassis to the end when reaching the safe position;
the plug bracket slides up relative to the rear of the chassis to the end when reaching the installation position;
the supply handle is parallel to the top of the chassis when pivoting to the installation position; and
the supply handle is parallel to the rear of the chassis when pivoting to the safe position.

5. The power supply as claimed in claim 4, wherein:
the chassis further has a mounting slot defined through the chassis between the top and the rear;
a handle bracket mounted on the inner surface of the chassis, corresponding to the mounting slot and having
- two opposite sides;
- an open top;
- an open front;
- a recess defined in the handle bracket and communicating with open top and the open front; and
- two pin holes defined respectively through the sides of the handle bracket;
the supply handle is mounted pivotally in the handle bracket through the mounting slot in the chassis and further has
- a pin hole defined through the proximal end of the supply handle; and
a pin extending through the pin holes in the handle bracket and the pin hole in the supply handle.

6. The power supply as claimed in claim 5, wherein:
the supply handle further has a cavity defined in the hook; and
the handle assembly further has a spring mounted in the cavity in the supply handle adjacent to the handle bracket around the pin and biasing the supply handle to be parallel to the top of the chassis in the installation position.

7. The power supply as claimed in claim 2, wherein:
the plug bracket slides down relative to the rear of the chassis to the end when reaching the safe position;
the plug bracket slides up relative to the rear of the chassis to the end when reaching the installation position;
the supply handle is parallel to the top of the chassis when pivoting to the installation position; and
the supply handle is parallel to the rear of the chassis when pivoting to the safe position.

8. The power supply as claimed in claim 6, wherein the supply handle further has a hook formed on the proximal end and mounted pivotally in the recess in the handle bracket and a positioning recess defined in the hook.

* * * * *